(12) United States Patent
Kim

(10) Patent No.: US 6,689,656 B2
(45) Date of Patent: Feb. 10, 2004

(54) DYNAMIC RANDOM ACCESS MEMORY AND THE METHOD FOR FABRICATING THEREOF

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/391,046

(22) Filed: Mar. 18, 2003

(65) Prior Publication Data

US 2003/0183861 A1 Oct. 2, 2003

Related U.S. Application Data

(62) Division of application No. 09/676,211, filed on Sep. 29, 2000, now Pat. No. 6,590,248.

(30) Foreign Application Priority Data

Sep. 29, 1999 (KR) ........................................ 1999-41671

(51) Int. Cl.[7] ......................................... H01L 21/8242
(52) U.S. Cl. ...................................... 438/243; 438/401
(58) Field of Search ............................... 438/243, 244, 438/386, 387, 401

(56) References Cited

U.S. PATENT DOCUMENTS

| | | | |
|---|---|---|---|
| 6,140,673 A | 10/2000 | Kohyama | |
| 6,271,081 B2 * | 8/2001 | Kajiyama | 438/243 |
| 6,451,648 B1 * | 9/2002 | Gruening et al. | 438/243 |
| 6,555,862 B1 * | 4/2003 | Mandelman et al. | 257/301 |

* cited by examiner

Primary Examiner—Chandra Chaudhari
(74) Attorney, Agent, or Firm—Timothy J. Keefer; Wildman, Harrold, Allen & Dixon LLP

(57) ABSTRACT

The present invention discloses a dynamic random access memory and the method for fabricating thereof. A first silicon substrate having a trench capacitor and a second silicon substrate having a transistor are formed with a double layer, which is interposed an insulation layer between therewith, thereby forming a trench capacitor at a region, which is used to be formed a transistor in the conventional art. Accordingly, when forming the trench capacitors, in which the numbers are the same as the conventional art, at the same silicon substrate area, a trench capacitor with large in diameter and shallow in depth can be formed, thereby performing a trench capacitor forming process. According to the present invention, after forming a trench, successive processes become easy and reliability of device can be enhanced.

7 Claims, 8 Drawing Sheets

DYNAMIC RANDOM ACCESS MEMORY AND THE METHOD FOR FABRICATING THEREOF

CROSS REFERENCE TO RELATED APPLICATION

This application is a Divisional of U.S. patent application Ser. No. 09/676,211 entitled "DYNAMIC RANDOM ACCESS MEMORY AND THE METHOD FOR FABRICATING THEREOF", filed on Sep. 29, 2000 now U.S. Pat. No. 6,590,248 which claims the priority of Korean patent application serial No. 99-41671, filed Sep. 29, 1999.

BACKGROUND OF THE INVENTION

1. Field of the Invention

The present invention relates to a dynamic random access memory and the method for fabricating thereof, and in particular to a trench capacitor type dynamic random access memory and the method for fabricating thereof.

2. Description of the Background Art

In recent years, semiconductor devices having the capacity of higher level of integration and a large volume have been studied.

Among those semiconductor devices, in case of a dynamic random access memory (hereinafter, which is referred as a DRAM) consisted of a plurality of cells, which are constructed by MOSFET (Metal Oxide Semiconductor Field Effect Transistor) and capacitors, many methods for miniaturizing the memory cell have been proposed in order to provide a semiconductor having the capacity of higher level of integration and a large volume.

One among the proposed methods for miniaturizing the memory cell is a DRAM cell having a general trench capacitor, which will be roughly described with reference to FIG. 1. FIG. 1 is a cross-sectional view of a DRAM cell fabricated according to a conventional art.

Referring to FIG. 1, a trench capacitor is constructed by a plate electrode 110, a capacitor dielectric layer 120, a charge storage electrode 130 and a strap 140. Generally, the depth of a trench is formed very deeply compared to the diameter of a semiconductor substrate 100.

A transistor has a drain electrode 220, a source electrode 230, a gate insulation layer 240 and a gate electrode 250, and is formed between the trench capacitors, which are adjoined with each other.

As described above, in the fabricating method according to the conventional art, a trench is formed very deeply compared with its diameter to secure the maximum capacitance in the same substrate area. That is, since capacitance of the capacitor is proportional to the area of a dielectric being formed between conductors, a trench has been formed deeply into the inside of the substrate in order to obtain the maximum capacitor area in a constant substrate area.

However, according to a semiconductor device having a capacity for higher level of integration, the deep to the diameter of the trench capacitor become increased more and more, as the result, a formation of a trench capacitor, that is, processes for forming a trench on a substrate and thereafter a dielectric layer and an electrode on the trench become very difficult, and the difficulty of the processes as described above results in reduction of the yield.

SUMMARY OF THE INVENTION

Accordingly, it is an object of the present invention to provide a DRAM in which a trench capacitor, which is more widen and shallow, is formed.

And, it is another object of the present invention to provide an align mark, which is adapted to use when fabricating a DRAM according to the present invention.

In order to achieve the above-described object of one aspect of the present invention, a dynamic random access memory having a trench capacitor, comprises: a first and a second silicon substrates which are interposed an insulation layer between thereof; a plurality of trench capacitors formed on the first silicon substrate; and transistors corresponding to the trench capacitors, respectively, formed on the second silicon substrate, in which the trench capacitors and the transistors are electrically connected with each other, respectively, by penetrating the insulation layer.

In order to achieve the above-described object of another aspect of the present invention, a method for fabricating a dynamic random access memory having a trench capacitor, comprises the steps of: forming a trench capacitor on the upper portion of a first semiconductor substrate doped with a first conductive type impurity; forming an insulation layer on the upper portion of the device body having the trench capacitor; attaching a second semiconductor substrate doped with a second conductive type impurity on the upper portion of the insulation layer; exposing a charge storage electrode of the trench capacitor by sequentially patterning the second semiconductor substrate and the insulation layer; forming a strap electrically connected with the charge storage electrode by filling a conductive material to the exposing portion, which is exposed by patterning the second semiconductor substrate and the insulation layer; removing a portion of the second semiconductor substrate and the strap and forming a device separating layer on the removed portion; and forming a transistor on the second semiconductor substrate, wherein a drain electrode of the transistor is electrically connected to the strap.

In order to achieve the above-described object of another aspect of the present invention, an alignment method when attaching the first and second semiconductor substrates comprises the steps of: forming an align key on the upper portion of the first semiconductor substrate; attaching the second semiconductor substrate to the upper portion of the first semiconductor substrate; exposing the align key on the first semiconductor substrate by etching the second semiconductor substrate; and aligning a transistor by the align key of the first semiconductor substrate when forming the transistor on the upper portion of the second semiconductor substrate.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A fabricating method of a DRAM in accordance with a preferred embodiment of the present invention will now be described with reference to the accompanying drawings.

First, the point of technical idea of the present invention is as follows: to easily perform the successive processes, and to form a trench capacitor, which is more widen and shallow, having a same capacity or more high capacity, a trench capacitor and a transistor, which have been fabricated on the same surface in a conventional art, are formed as a double structure, as a result, the area for forming a transistor in the conventional art is used as a capacitor forming area. An explanation described hereinafter must be understood from the point of technical idea and various modifications can be considered.

Figure 1:
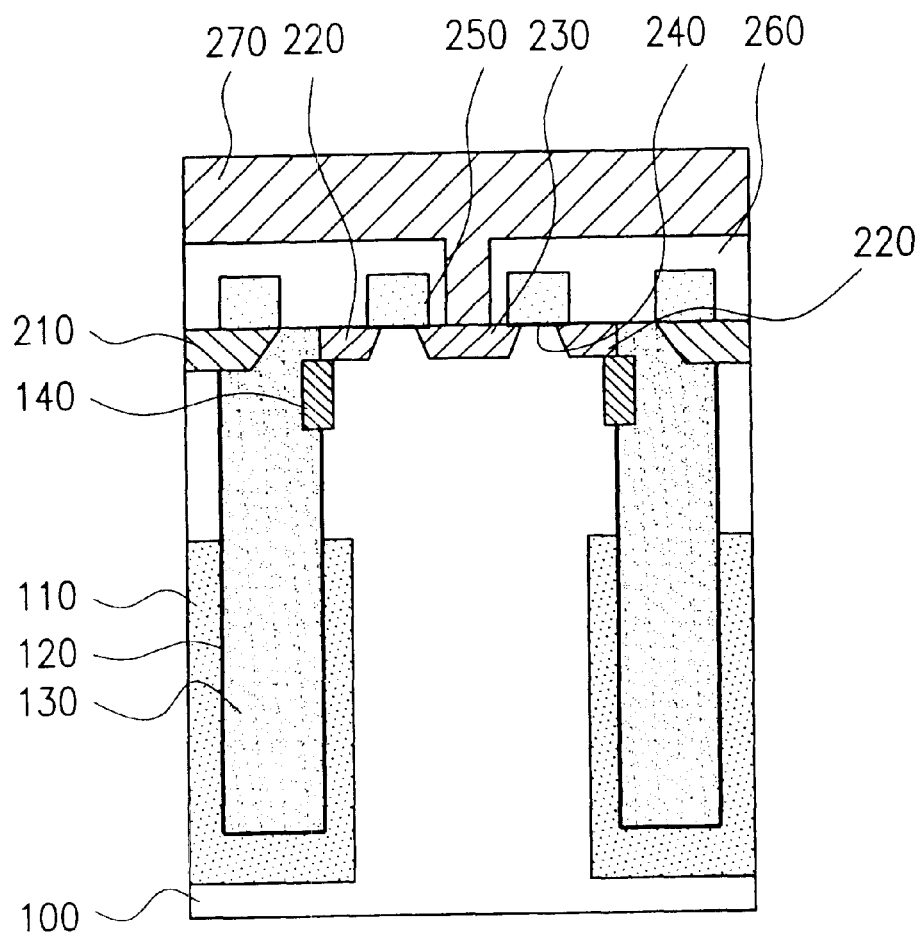
FIG. 1 is a cross-sectional view of a DRAM cell fabricated in accordance with a conventional art.
Figure 2:
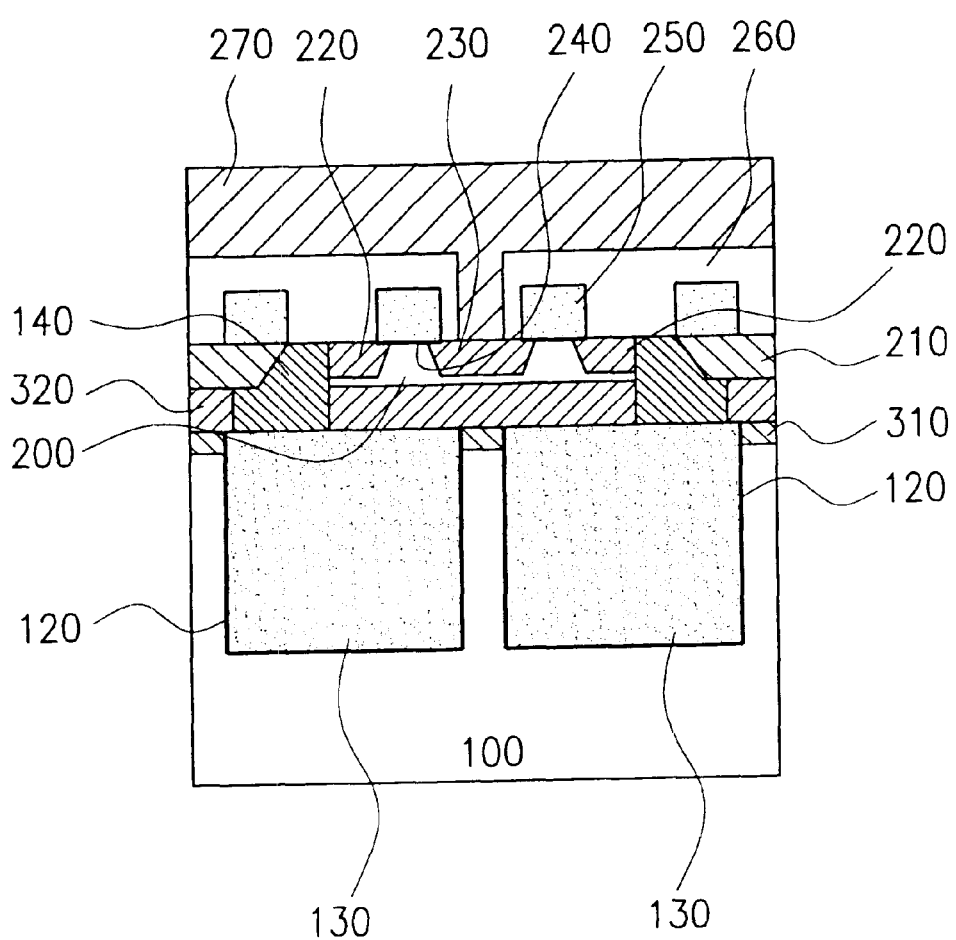
FIG. 2 is a cross-sectional view illustrating a DRAM cell in accordance with a preferred embodiment of the present invention.

FIG. 2 which is hereinafter will be described is a cross-sectional view of a DRAM cell in accordance with a preferred embodiment of the present invention, FIGS. 3a to 3f are views illustrating the processes of fabricating method of a DRAM cell in accordance with a preferred embodiment of the present invention, FIG. 4 is an exemplified view illustrating an align key being formed on a scribe line of a first substrate in accordance with a preferred embodiment of the present invention. At this time, in FIG. 2, to help understanding of the present invention, same reference numerals are denoted at the same layers compared with the conventional art.

A DRAM in accordance with a preferred embodiment of the present invention with reference to FIG. 2 will be described as follows.

First, in a feature of the DRAM in accordance with the preferred embodiment, a first silicon substrate formed a trench capacitor and a second silicon substrate formed a transistor are formed with a double layer, which is interposed an insulation layer between therewith, thereby forming a trench capacitor at a region, which is used to be formed a transistor in the conventional art. Accordingly, when forming the trench capacitors, in which the numbers are the same as the conventional art, at the same silicon substrate area, a trench capacitor with large in diameter and shallow in depth can be formed, thereby performing a trench capacitor forming process.

More detailed explanation will be described with reference to the FIG. 2. A plurality of capacitor is formed on a first semiconductor substrate 100. At this time, a trench capacitors is constructed by: a plate electrode being used the first semiconductor substrate 100 doped by a first conductive type (for example, an n-type impurity) impurity, NO(nitride oxide), ONO(oxide nitride oxide) formed along the trench wall formed at the semiconductor substrate 100 and other high dielectric layer as a dielectric material having a high dielectric ratio, a charge storage electrode as a conductive materials (for example, a poly-silicon) charged within the capacitor dielectric layer 120. At this time, when comparing the capacitor of the preferred embodiment of the present invention with that of the conventional art, the trench capacitor of the preferred embodiment has a large diameter and a shallow depth compared to the conventional art. That is, since a trench capacitor is extended to the area, which are formed with a transistor of the conventional art, thereby having a large diameter. Accordingly, in the present invention has a shallow in depth in same capacitances compared to the conventional art.

And, a second semiconductor substrate 200 is formed on the upper portion of the semiconductor substrate 100 formed the trench capacitor and is positioned between the first insulation layer 320. A plurality of transistor is formed on the second substrate 200. At this time, each drain electrode 220 of the transistor formed on the second substrate 200 is electrically connected with the charge storage electrode 130 of the trench capacitor formed on the first semiconductor substrate 100 by a strap 140 formed through the first insulation layer 320. And, each source electrode 230 of a transistor formed on the second semiconductor substrate 200 is electrically connected with a bit line 270 formed through the second insulation layer 260.

Hereinafter, with reference to FIGS. 3 and 4, a fabrication method of a DRAM in accordance with a preferred embodiment of the present invention will be described.

Figure 3A:
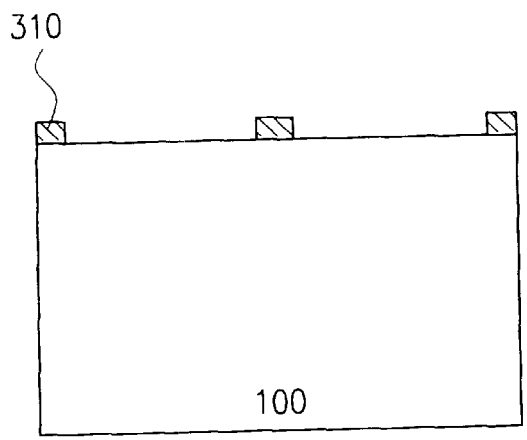
FIGS. 3a to 3g are views illustrating processes of the fabricating method of a DRAM cell in accordance with a preferred embodiment of the present invention.

First, referring to FIG. 3a, a trench mask 310 is formed on the upper portion of the first semiconductor substrate 100. That is, an oxide layer, a nitride layer and an oxide layer are successively formed on the upper portion of the first semiconductor substrate 100 and thereafter, the oxide layer, the nitride layer and the oxide layer, which are positioned to the portion for forming a trench capacitor, are removed by a general photolithography methodology. At this time, preferably, the first semiconductor substrate 100 is a substrate doped with a first conductive type (for example, an n-type impurity) in order to use it as a plate electrode of a capacitor.

Figure 3B:
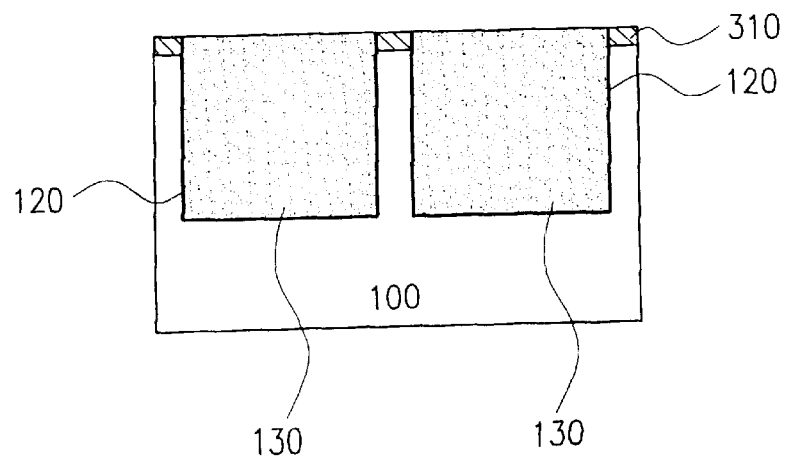

Referring to FIG. 3b, the first semiconductor substrate 100 is removed with a constant depth (for example, the depth within a range of 3–5 um) by a general dry or wet etch methodology, using a trench mask 310, thereby forming a trench.

As described above, after forming the trench, a dielectric material having a high permittivity such as NO(Nitride oxide), ONO(oxide nitride oxide) or others is deposited on the upper portion of the device body including the trench by using a chemical vapor deposition method or a physical vapor deposition method, thereby forming a dielectric layer 120 of a capacitor.

Thereafter, a conductive material (for example, a poly-silicon) is deposited on the upper portion of the dielectric layer 120 of the capacitor, thereby forming a charge storage electrode 130.

Thereafter, a capacitor dielectric layer 120 and a charge storage electrode 130 formed on more upper portion than a surface of a remnant trench mask 310 are removed by an etch back process etc, thereby forming a trench capacitor. At this time, if there is no a remnant trench mask 310, a capacitor dielectric layer 120 and a charge storage electrode 130 formed on more upper portion than the surface of the first semiconductor substrate 100. On the other hand, in an another embodiment, when removing a capacitor dielectric layer 120 and a charge storage electrode, the trench mask 310 remained on the upper portion of the first semiconductor substrate 100 may be removed completely.

Figure 3C:
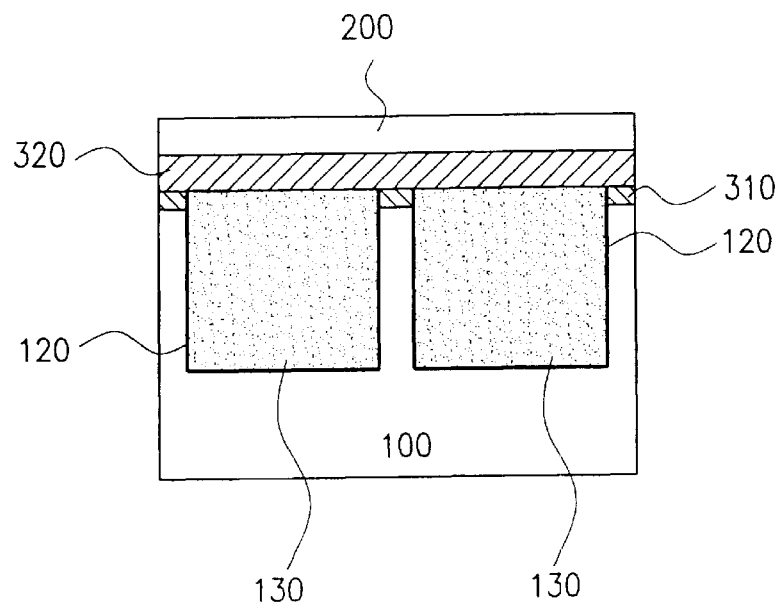

Referring to FIG. 3c, a nitride or an oxide is deposited on the whole surface of the device body formed a trench capacitor by the above-described processes, thereby forming a first insulation layer 320. At this time, the first insulation layer 320 is used to insulate a second semiconductor substrate 200 and a trench capacitor, which will be attached at the successive steps. The first insulation layer 320 may be formed on the second semiconductor substrate 200 connected with the first semiconductor substrate 100, not the first semiconductor substrate, or the both substrates 100 and 200.

Thereafter, a second semiconductor substrate 200 is attached to the upper portion of a first insulation layer 320. At this time, preferably, the second semiconductor substrate 200 is used to a substrate doped with a second conductive impurity (for example, a p type impurity). And, when the second semiconductor substrate 200 is formed on the first insulation layer 320, since the alignment key formed on the first semiconductor substrate 100 is embedded with the lower portion of the second semiconductor substrate 200, a process for exposing a portion formed the alignment key (for example, a scribe line of the first semiconductor substrate 100) must be processed in order to alignment process at the next process.

An alignment method in accordance with a preferred embodiment of the present invention will be described with reference to FIG. 4.

Figure 4A:
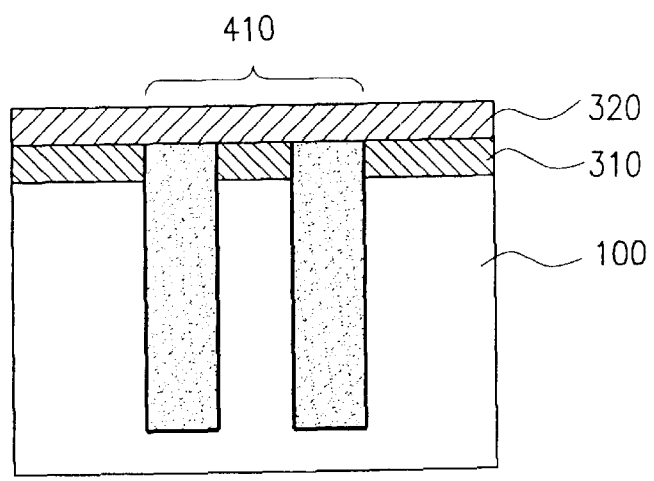
FIG. 4 is an exemplified view illustrating an align key being formed on a scribe line of a first substrate in accordance with a preferred embodiment of the present invention.
Figure 4B:
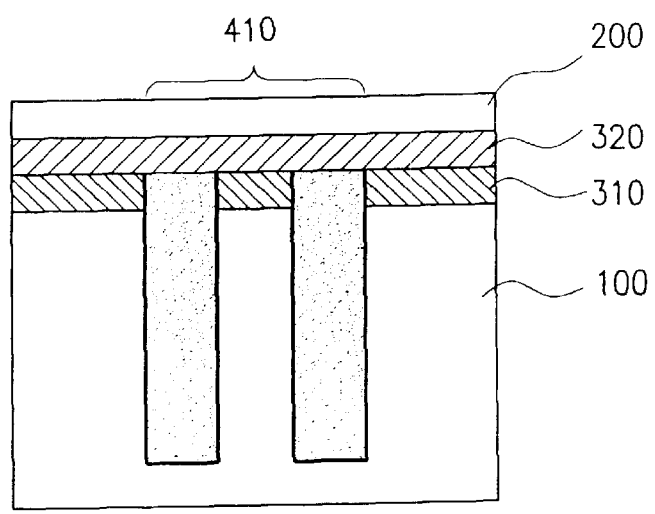
Figure 4C:
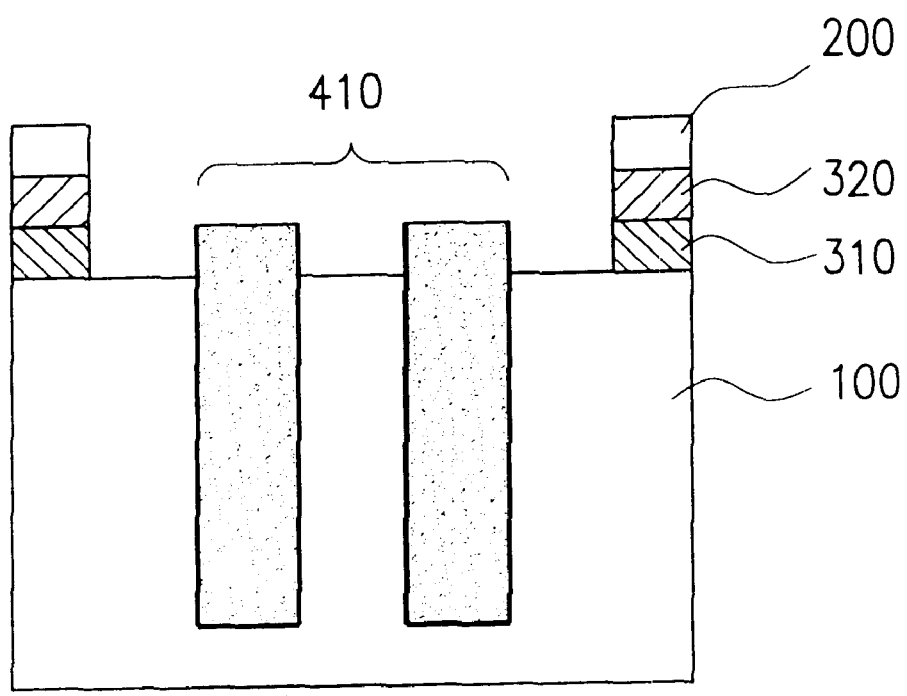

First, referring to FIG. 4a, during a trench capacitor is formed on the first semiconductor substrate 100, a trench capacitor of same shape, that is an align key, is also formed on the scribe line of the first semiconductor substrate 100. Thereafter, as shown in FIG. 4b, after forming an insulation layer on the first semiconductor substrate 100, a second semiconductor substrate is formed on the first semiconductor substrate 100. Thereafter, as shown in FIG. 4c, the trench capacitor, that is an align key, formed on the scribe line of the first semiconductor substrate 100 is exposed by an etch process etc. Thereafter, each layer being formed on the second semiconductor substrate 200 is aligned by using the align key. Although the align key is used in the embodiment of the present, when two or more layer is used as a double layer, the align key may be easily adapted in other semiconductor processes in which a lower layer is covered by an upper layer.

Figure 3D:
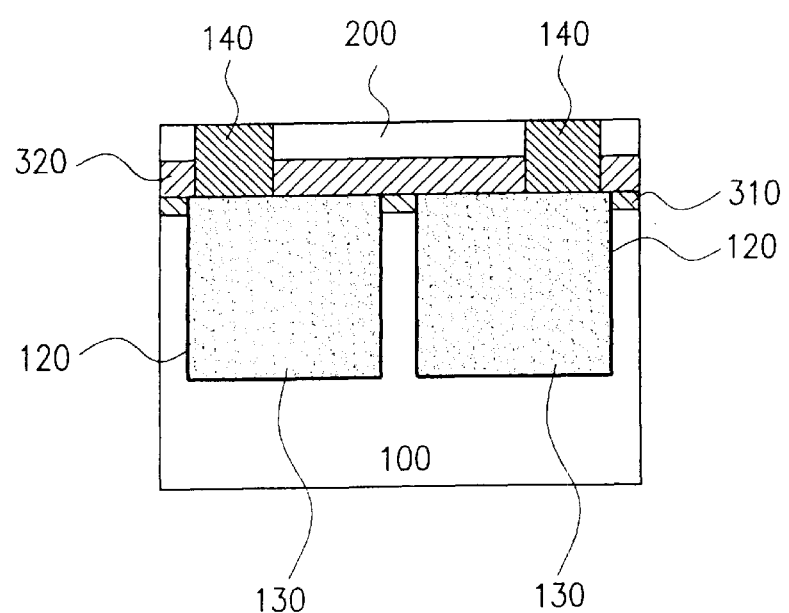

Referring to FIG. 3d, the second semiconductor substrate 200 and the first insulation layer 320 are sequentially patterned, thereby forming a groove partially exposed the charge storage electrode 130. Thereafter, after depositing a conductive material on the whole surface of the device body including the groove, a conductive material formed more higher than the surface of the second semiconductor substrate 200 is removed by an etch back methodology, thereby forming a strap 140. At this time, a conductive material, as a silicon doped with high concentration of a first conductive type impurity (for example, a n-type impurity) may be used.

Figure 3E:
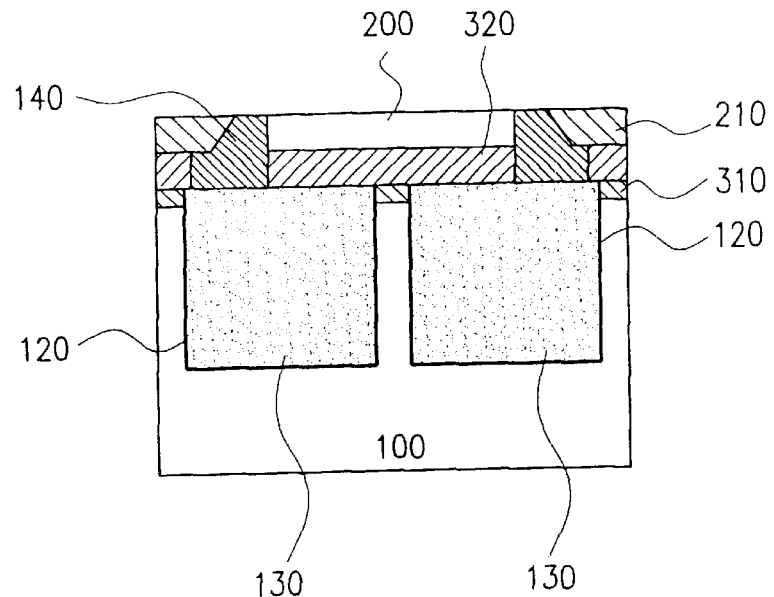

Referring to FIG. 3e, a portion of the strap 140 and the second semiconductor substrate 200 is removed by a photolithography method and then an oxide etc is deposited to the removed portion, thereby forming a device separation layer 210.

Figure 3F:
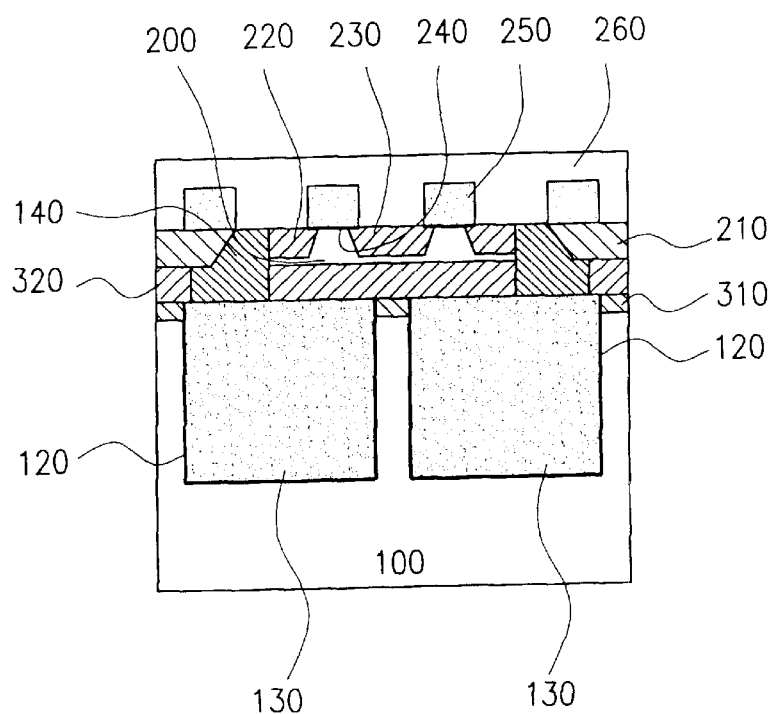

Referring to FIG. 3f, by using a general transistor forming method, a source electrode 230, a drain electrode 220, a gate insulation layer 240 and a gate electrode 250 are formed on the second semiconductor substrate 200. At this time, a drain electrode 220 must be formed in order to be electrically connected it with a strap 140 for connecting.

On the other hand, in the embodiment, after forming a strap 140, a transistor in which a drain electrode 230 is electrically connected with the strap 140 is formed, in an another embodiment, before forming the strap 140, a transistor is formed on the second semiconductor substrate 200 and thereafter a strap 140 may be formed in order to be electrically connected the drain electrode 140 of the transistor.

Thereafter, an oxide layer or an insulation layer is deposited on the whole surface of the device body formed the transistor, thereby forming a second insulation layer 260.

Figure 3G:
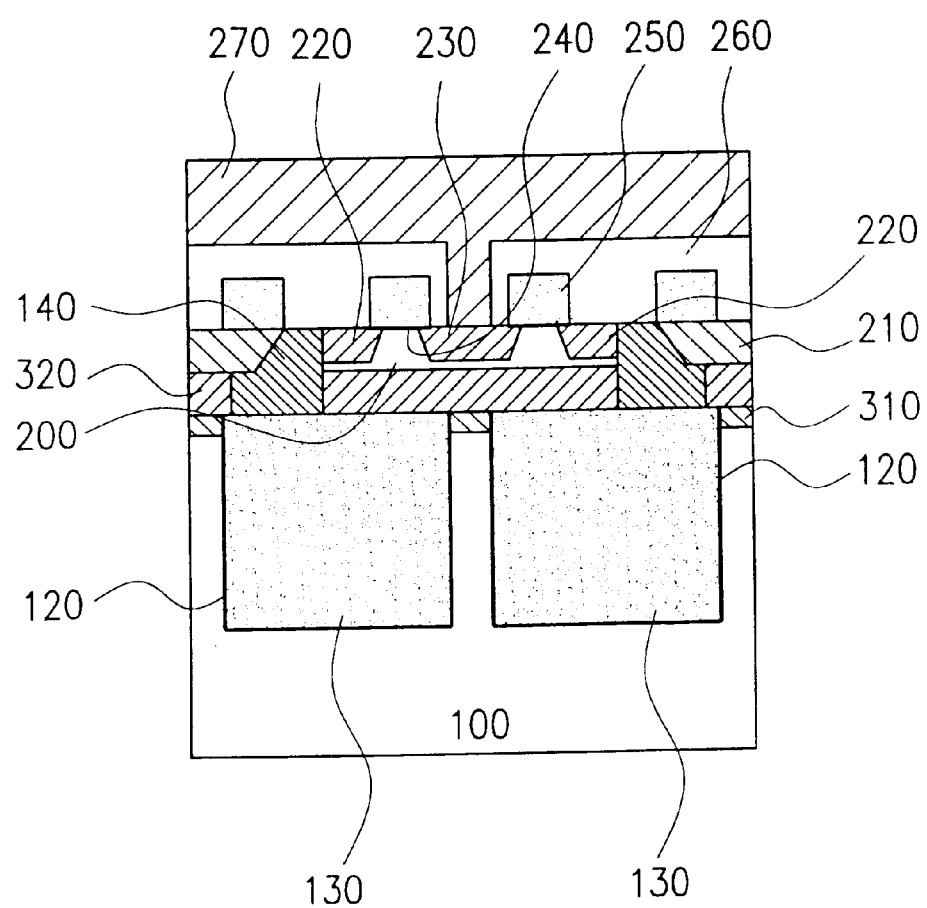

Referring to FIG. 3g, the second insulation layer is patterned and a contact hole being exposed a source electrode 230 is formed, a conductive material is deposited on the upper portion of the second insulation layer 260 including the contact hole, thereby forming a bit line 270.

As described above, according to the present invention, a region in which a conventional transistor is formed is used as a region for forming a trench capacitor and the device area which is the same as that of the conventional art, a trench capacitor can be formed with more wider and shallow, so that after forming a trench, successive processes become easy and reliability of device can be enhanced.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a dynamic random access memory having a trench capacitor, comprising the steps of:

forming a trench capacitor on the upper portion of a first semiconductor substrate doped with a first conductive type impurity;

forming an insulation layer on the upper portion of the device body having the trench capacitor;

attaching a second semiconductor substrate doped with a second conductive type impurity on the upper portion of the insulation layer;

exposing a charge storage electrode of the trench capacitor by sequentially patterning the second semiconductor substrate and the insulation layer;

forming a strap electrically connected with the charge storage electrode by filling a conductive material to the exposing portion, which is exposed by patterning the second semiconductor substrate and the insulation layer;

removing a portion of the second semiconductor substrate and the strap and forming a device separating layer on the removed portion; and forming a transistor on the second semiconductor substrate wherein a drain electrode of the transistor is electrically connected to the strap.

2. The method according to claim 1, wherein the method further comprising the steps of:

exposing an align key, which is formed in forming step the trench capacitor to the first semiconductor substrate, after attaching the second semiconductor substrate.

3. The method according to claim 1, wherein the strap is formed to be electrically connected with a drain electrode of the transistor after forming a transistor on the second semiconductor substrate.

4. The method according to claim 3, wherein the strap is formed with silicon which is doped with a first conductive type impurity having a high concentration.

5. The method according to claim 1, wherein the first conductive type impurity is an n-type impurity and the second conductive type impurity is a p-type impurity.

6. The method according to claim 1, wherein an alignment method when attaching the first and second semiconductor substrates comprising the steps of:

forming an align key on the upper portion of the first semiconductor substrate;

attaching the second semiconductor substrate to the upper portion of the first semiconductor substrate;

exposing the align key on the first semiconductor substrate by etching the second semiconductor substrate; and aligning a transistor by the align key of the first semiconductor substrate when forming the transistor on the upper portion of the second semiconductor substrate.

7. The method according to claim 6, wherein the align key is a trench capacitor being formed at the scribe line on the first semiconductor substrate.

* * * * *